United States Patent
Buck, Jr. et al.

(10) Patent No.: US 7,777,313 B2
(45) Date of Patent: Aug. 17, 2010

(54) ELECTRONIC PACKAGE STRUCTURES AND METHODS

(75) Inventors: Roy Vesper Buck, Jr., Oak Ridge, NC (US); Joseph Samuel Bergeron, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 539 days.

(21) Appl. No.: 11/345,147

(22) Filed: Jan. 31, 2006

(65) Prior Publication Data
US 2006/0273447 A1 Dec. 7, 2006

Related U.S. Application Data

(60) Provisional application No. 60/688,736, filed on Jun. 7, 2005.

(51) Int. Cl.
*H01L 23/02* (2006.01)
(52) U.S. Cl. .................. 257/678; 257/686; 257/700
(58) Field of Classification Search ............ 257/678, 257/734, 700, 686
See application file for complete search history.

(56) References Cited

U.S. PATENT DOCUMENTS

| | | | | |
|---|---|---|---|---|
| 4,682,207 A * | 7/1987 | Akasaki et al. | ............ | 257/700 |
| 5,014,115 A * | 5/1991 | Moser | ............ | 257/659 |
| 5,477,933 A * | 12/1995 | Nguyen | ............ | 174/262 |
| 5,731,633 A * | 3/1998 | Clayton | ............ | 257/723 |
| 6,075,710 A * | 6/2000 | Lau | ............ | 361/760 |
| 6,163,462 A * | 12/2000 | Buck | ............ | 361/767 |
| 6,476,471 B1 * | 11/2002 | Buck, Jr. | ............ | 257/678 |
| 6,762,502 B1 | 7/2004 | Akram | ............ | 257/781 |
| 6,791,168 B1 | 9/2004 | Connell et al. | ............ | 257/668 |
| 6,791,195 B2 | 9/2004 | Urushima | ............ | 257/783 |
| 6,812,552 B2 | 11/2004 | Islam et al. | ............ | 257/666 |
| 6,878,571 B2 * | 4/2005 | Isaak et al. | ............ | 438/107 |
| 6,900,079 B2 | 5/2005 | Kinsman et al. | ............ | 438/127 |
| 7,180,165 B2 * | 2/2007 | Ellsberry et al. | ............ | 257/686 |
| 2002/0171133 A1* | 11/2002 | Mok et al. | ............ | 257/678 |

OTHER PUBLICATIONS

Thienpont, Dinise, "Flip Chip CSP Packages", Application Note AND8081/D, ON Semiconductor, Aug. 2003, pp. 1-5.
Ghaffarian, Reza, et al., "Technology Readiness Overview: Ball Grid Array and Chip Scale Packaging", NASA NEPP Program Document, Jan. 2003, pp. 1-12.
Solberg, Vern, "Singulating Chip-Scale Packages", Chip Scale Review, Jul. 1998.

(Continued)

*Primary Examiner*—N Drew Richards
*Assistant Examiner*—Swapneel Chhaya
(74) *Attorney, Agent, or Firm*—Koppel, Patrick, Heybl & Dawson

(57) ABSTRACT

Electronics packages are provided with structure that provides a significantly-reduced package footprint and also facilitates substantial reduction of package fabrication time and cost. The footprint reduction is realized with a frame that defines an aperture wall which surrounds first sets of components on the first side of a printed circuit board and also extends away from the printed circuit board to provide package input/output access along the perimeter of the package footprint. The second side of the printed circuit board receives a second set of components and this set is protected by a board fill. The frame and printed circuit board are configured for realization from frame and board panels whose planar forms substantially reduce package fabrication time and cost because they facilitate the use of modern high-speed printed circuit board (PCB) fabrication processes.

5 Claims, 7 Drawing Sheets

OTHER PUBLICATIONS

Schueller, Randy D, et al., Meeting the Cost/Performance Requirements of Flex-Based Chip-Scale Packages, Chip Scale Review, Jan. 1999.

Fillion, R., et al., "New Wafer Level Structure for Stress Free Area Array Solder Attach", Global SMT and Packaging, Feb. 2004.

* cited by examiner

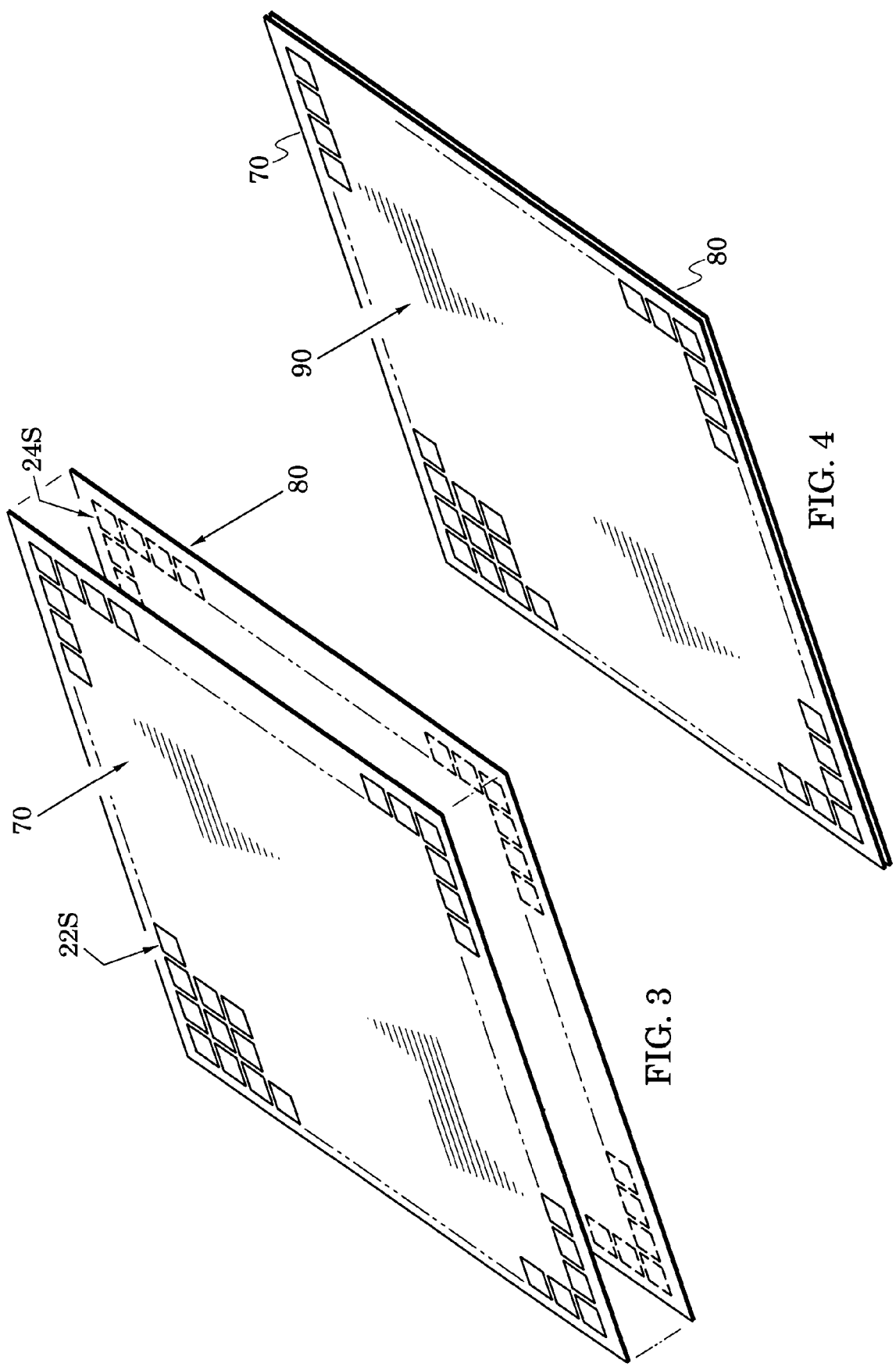

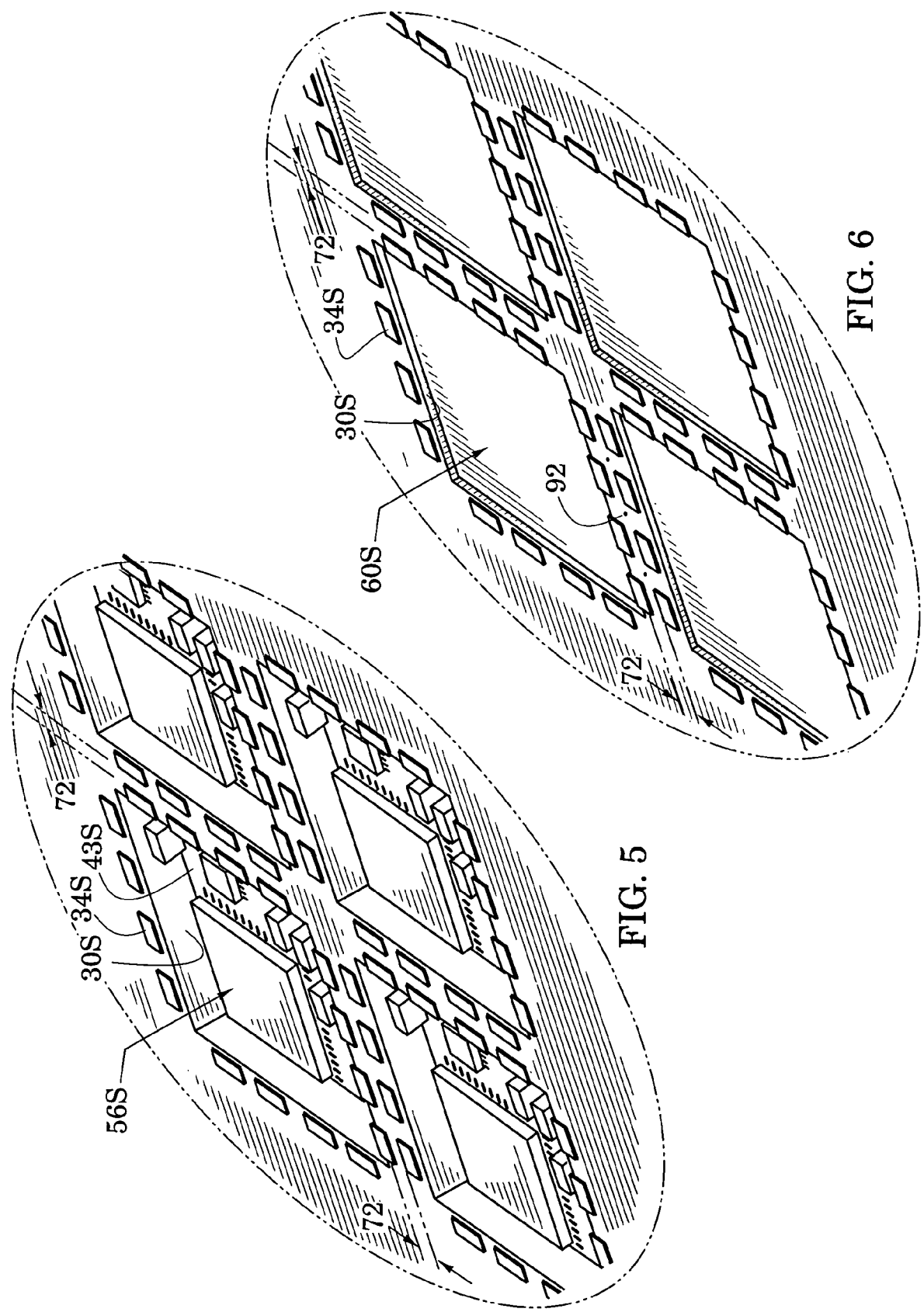

ELECTRONIC PACKAGE STRUCTURES AND METHODS

CROSS REFERENCES TO RELATED APPLICATIONS

This application claims the benefit of U.S. Provisional Application Ser. No. 60/688,736 which was filed Jun. 7, 2005.

BACKGROUND OF THE INVENTION

1. Field of the Invention

The present invention relates generally to electronic packages.

2. Description of the Related Art

There are constant economic pressures to incorporate more electronic components and functions into smaller volumes while insuring the reliability of the resulting electronic packages and maintaining low package costs. Although a wide range of package configurations have evolved in response to these pressures, they generally require excessive package footprints and fail to fully realize the desired reliability and reduced costs.

BRIEF SUMMARY OF THE INVENTION

The present invention is directed to electronics package structures that provide significantly-reduced package footprints and also facilitate substantial reduction of package fabrication time and cost. The novel features of the invention are set forth with particularity in the appended claims. The invention will be best understood from the following description when read in conjunction with the accompanying drawings.

BRIEF DESCRIPTION OF THE DRAWINGS

FIG. 3 is an isometric view which illustrates a process of abutting a first frame side of the frame panel of FIG. 1 with the first board side of the board panel of FIG. 2;

FIG. 4 is an isometric view which shows abutted frame and board panels subsequent to the process of FIG. 3;

FIG. 5 is an enlarged view of a portion of FIG. 4 which illustrates printed circuit board structures of the board panel of FIG. 2 and received sets of electronic components visible within corresponding frame structures of the frame panel of FIG. 1;

FIG. 6 illustrates the view of FIG. 5 after frame fills have been installed in the frame structures and printed circuit board structures of FIG. 5;

DETAILED DESCRIPTION OF THE INVENTION

Figure 10:
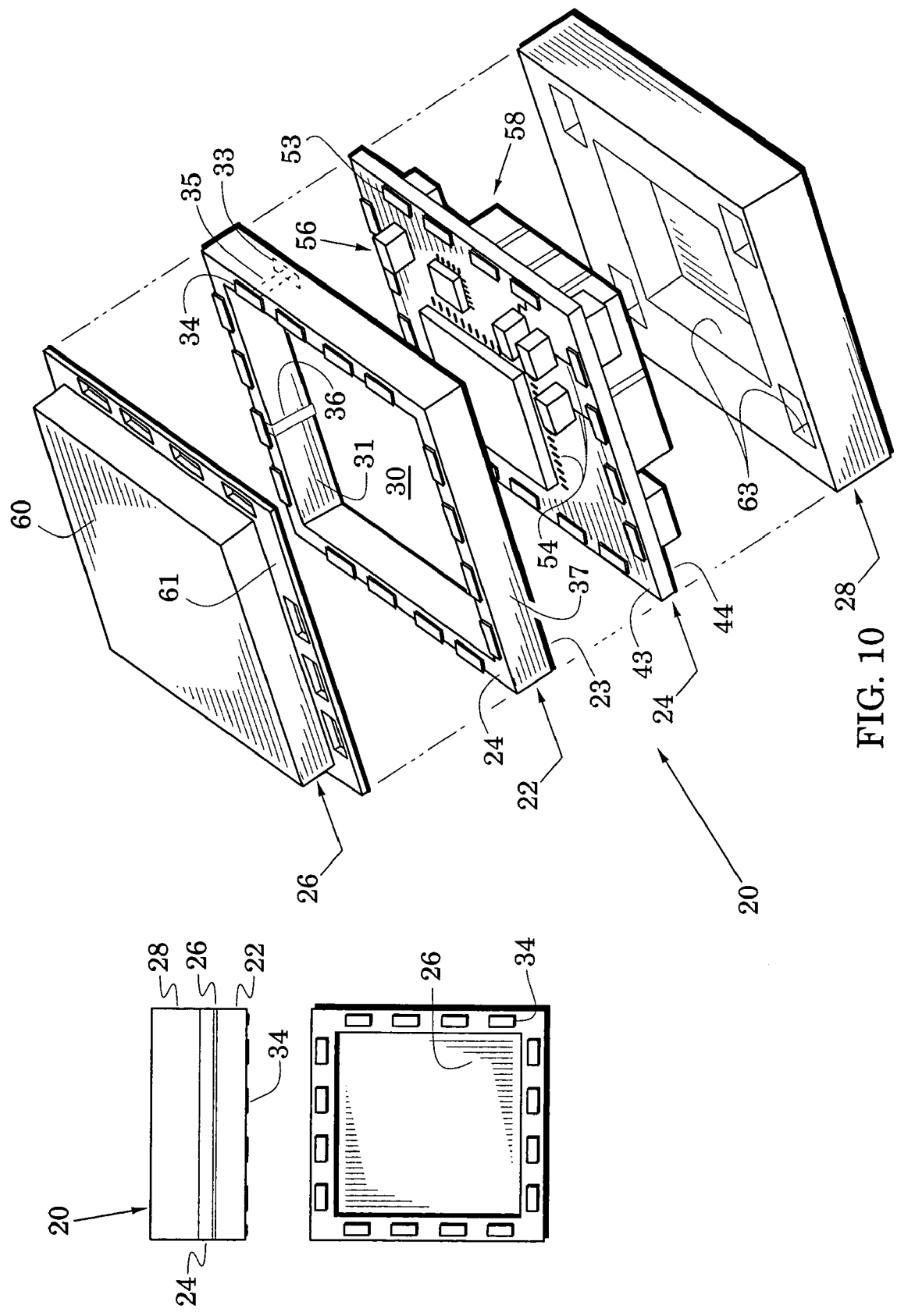
FIG. 10 includes an exploded isometric view of an exemplary one of electronics packages that are realized by sawing through frame and board streets introduced in FIGS. 1 and 2 and FIG. 10 further includes side and bottom views of the electronics package.

Attention is initially directed to FIG. 10 which illustrates an electronics package embodiment 20 whose structure provides a significantly-reduced package footprint and also facilitates substantial reduction of package fabrication time and cost. The footprint reduction is realized with a frame that defines an aperture wall which surrounds first sets of components on the first side of a printed circuit board and also extends away from the printed circuit board to provide package input/output access along the perimeter of the package footprint.

The second side of the printed circuit board receives a second set of components and this set is protected by a board fill. The frame and printed circuit board are configured for realization from frame and board panels whose planar forms substantially reduce package fabrication time and cost because they facilitate the use of modern high-speed printed circuit board (PCB) fabrication processes.

In particular, FIG. 10 illustrates an exploded view of an electronics package 20 that includes a frame 22, a printed circuit board 24, a frame fill 26 and a board fill 28. The frame 22 defines an aperture 30 between aperture walls 31, has first and second frame sides 23 and 24, and has first and second frame pads 33 and 34 arranged adjacent the aperture and positioned respectively on the first and second frame sides. As shown in FIG. 10, an outer frame wall 37 is outwardly spaced from the aperture wall 31 to thereby communicate between the first and second frame sides 23 and 24 and bound the frame 22.

Each first frame pad 33 (only one is shown in broken lines) is connected to a corresponding one of the second frame pads 34. In an embodiment, this connection is realized with a via 35 (also shown in broken lines) that internally passes through the frame. In another embodiment, this connection is made by realizing corresponding first and second frame pads as opposite ends of an interconnect structure 36 that extends through the aperture 30 and passes along the interior of an aperture wall 31.

The printed circuit board 24 has first and second board sides 43 and 44 and has board pads 53 arranged on the first board side to each contact a corresponding one of the first frame pads 33. The printed circuit board 24 carries printed circuit paths 54 on the first and second board sides 43 and 44 and these paths are arranged to communicate with the board pads 53 with the paths on the first and second board sides respectively receiving first and second sets 56 and 58 of electronic components (only a few paths are shown on the first board side and are arranged for exemplary purposes only). The board pads 53 and the printed circuit paths 54 provide all necessary circuit connections to access and operate the first and second sets of electronic components on the printed circuit board 24. Although the first and second frame pads 33 and 34 and the board pads 53 have been shown (e.g., as in FIG. 10) to have a rectangular shape, other shape embodiments (e.g., square and circular) may be used in other package embodiments.

The frame fill 26 is configured to cover the first set 56 of components and the first board side 43 and fully enclose the first frame pads 33 and board pads 53. Although the exploded view of FIG. 10 shows the frame spaced away from the frame 22 and printed circuit board 24, it is shown in the form it would assume after it has flowed into the aperture 30, onto the first board side 43 and around the first frame pads 33 and board pads 53. Accordingly, it has a body 60 that conforms to the aperture 30 and a surrounding lip 61 that encloses the first frame pads 33 and board pads 53. The lip 61 is thus captured between the first frame side 33 and the first board side 43 as indicated in the package side view of FIG. 10.

The board fill 28 is configured to cover the second set 58 of components and the second board side 44. Accordingly, it has pockets 63 that conform to the components of the second set 58.

The electronics package 20 is especially suited to carry a wide range of electronic components which may include passive elements (e.g., resistors, capacitors, inductors and transformers), unpackaged integrated circuits (ICs) (e.g., analog, digital, optical, and radio frequency ICs), packaged ICs, and micro-electrical-mechanical systems (MEMS). The packaged components may include leadless chip carriers (LCCs), plastic ball grid arrays (PBGAs), ceramic ball grid arrays (CBGAs) and flip chips. In FIG. 10, the first and second sets 56 and 58 are shown with exemplary forms that are intended to indicate at least a few of this wide range of electronic components.

FIG. 10 also includes bottom and side views of the electronics package 20. Although these views are not as enlarged as the exploded view, they are still substantially larger than typical electronics package embodiments of the invention which might, for example, have approximate dimensions on the order of 8×8×5 millimeters.

Figure 1:
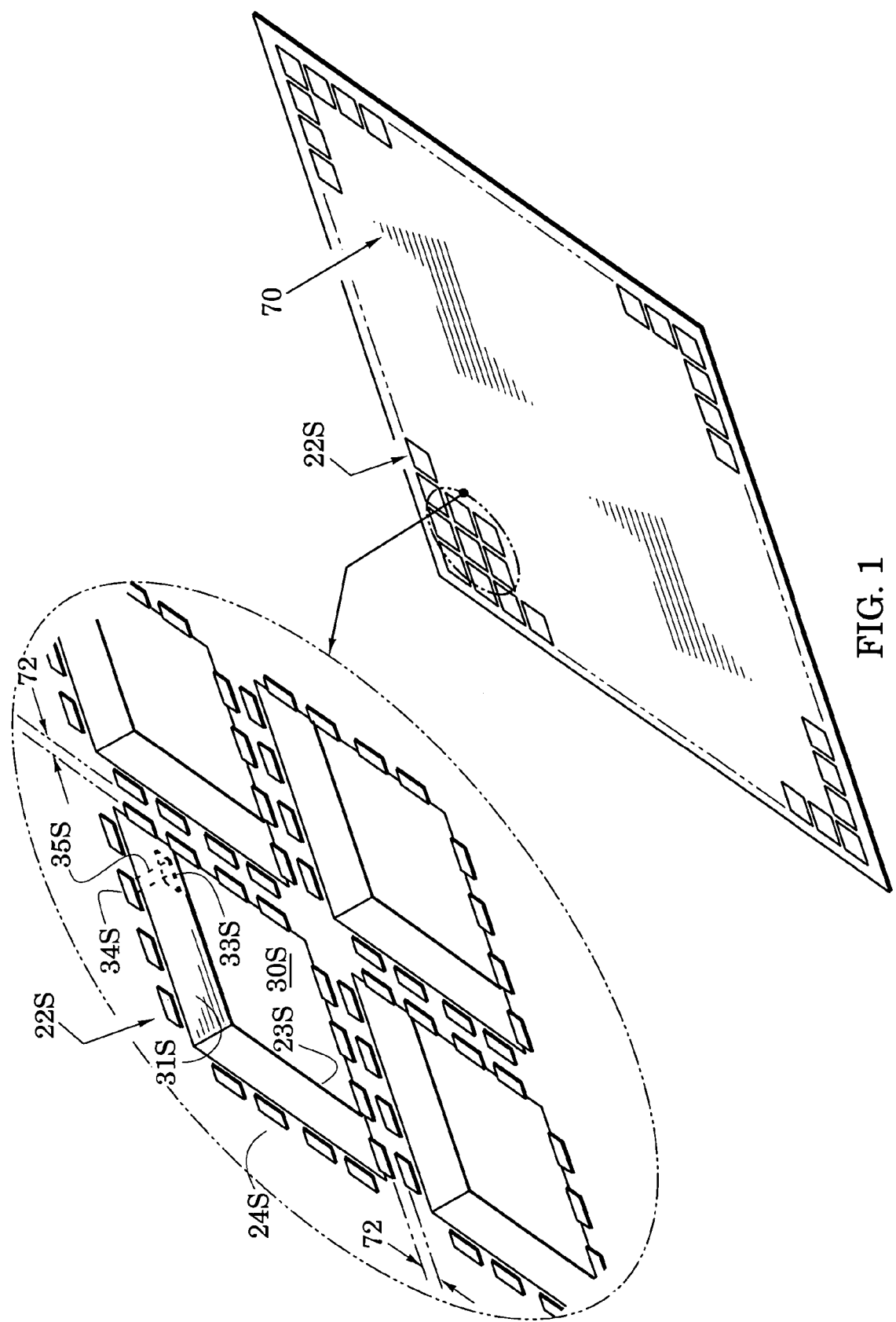
FIG. 1 includes an isometric view of a frame panel embodiment of the present invention and an enlarged view of exemplary frame structures in the frame panel.

Attention is now directed to FIGS. 1-9 which illustrate method embodiments for structuring the electronics package of FIG. 10. In particular, FIG. 1 illustrates that a planar frame panel 70 is provided and is configured with a substantial number (e.g., 120) of frame structures 22S that are spaced apart to define frame streets 72 therebetween. As seen in the enlarged view of FIG. 1, each of the frame structures 22S defines an aperture 30S with aperture walls 31S that communicate between first and second frame sides 23S and 24S.

Each of the frame structures also defines first and second frame pads 33S and 34S arranged adjacent the aperture and positioned respectively on the first and second frame sides 23S and 24S (only one first frame pad 33S is shown in broken lines to indicate that it is on the first frame side 23S). Each first frame pad 33 is connected to a corresponding one of the second frame pads 34. As described above with respect to FIG. 10, this connection may be accomplished with a variety of metallization structures (e.g., an internal via 35S is shown in FIG. 1).

A reference number 22S has been assigned to the frame structures to indicate that any of them can be converted to the frame 22 of FIG. 10 by cutting through the frame streets 72. Similarly, reference numbers 23S, 24S, 31S, 30S, 33S, 34S and 35S have been assigned to the first and second frame sides, aperture wall, aperture, first and second frame pads, and via to indicate that they are converted to corresponding portions of the frame 22 of FIG. 10 when the frame streets 72 are cut through.

Figure 2:
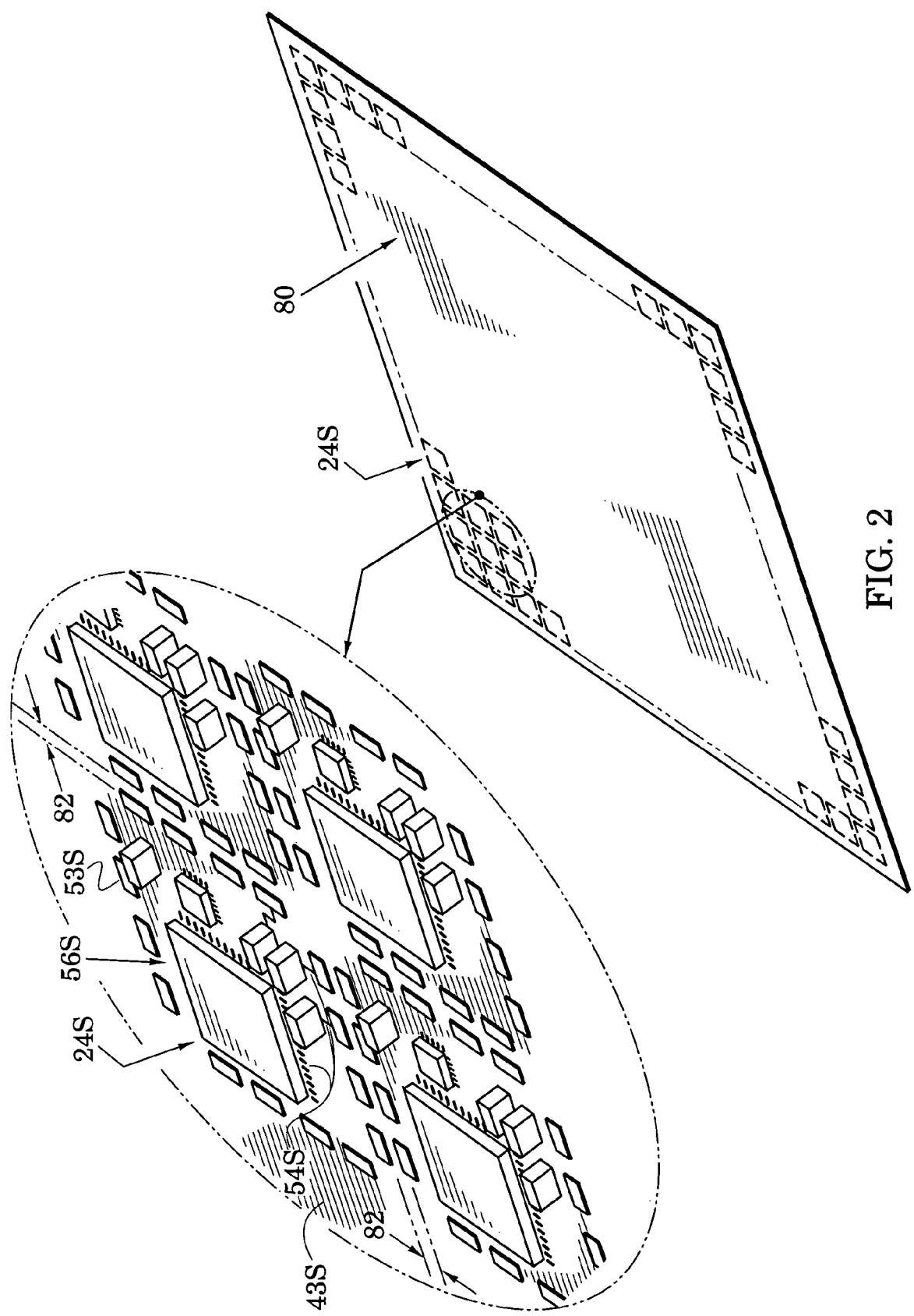
FIG. 2 includes an isometric view of a first side of a board panel embodiment and an enlarged view of exemplary printed circuit board structures in the board panel which receive first sets of electronic components.
Figure 8:
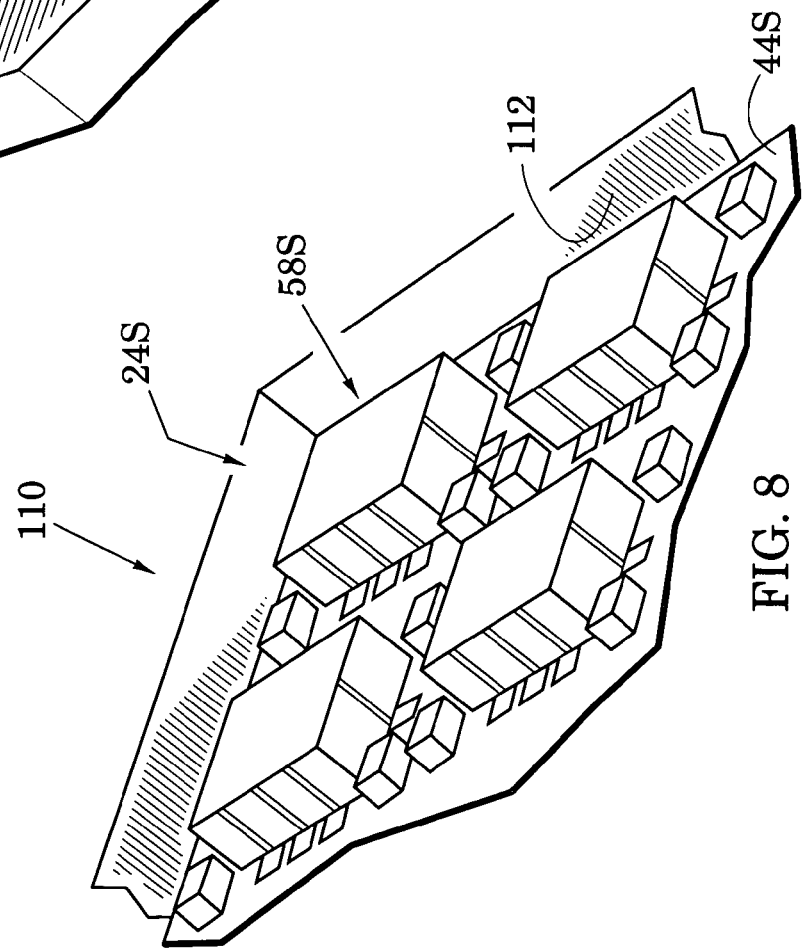
FIG. 8 is an isometric view, similar to the enlarged view of FIG. 7, which shows installation of a dam about the board panel.

FIG. 2 illustrates that a planar board panel 80 is provided and is configured with printed circuit board structures 24S that are spaced apart to define board streets 82 therebetween. The board streets are spaced identically to the frame streets 72 of FIG. 1 so that each corresponds to a respective one of the frame streets. Each of the printed circuit board structures 24S defines first and second board sides 43S and 44S and has board pads 53S arranged on the first board side to each contact a corresponding one of the first frame pads 33S in FIG. 1 (the second board sides 44S are not visible in FIG. 2 but are opposite the first board sides 43S as seen in FIGS. 8 and 10). Each printed circuit board structure 24S carries printed circuit paths 54S on the first and second board sides 43S and 44S that are arranged to communicate with the board pads 53S and receive, on the first board side, the first set 56S of electronic components shown in FIGS. 5 and 10.

Similar to the planar frame panel of FIG. 1, reference number 24S has been assigned to the printed circuit board structures to indicate that any of them can be converted to the printed circuit board structure 24 of FIG. 10 by cutting through the board streets 82. Reference numbers 43S, 44S, 53S, 54S, and 56S have been assigned to the first and second board sides, board pads, printed circuit paths, and first sets of components to indicate that they are converted to corresponding portions of the printed circuit board 24 of FIG. 10 when the streets 82 are cut through.

FIG. 3 illustrates a process of moving the frame panel 70 and board panel 80 so that the first frame sides (23S in FIG. 1) approach the first board sides (43S in FIG. 2). This process is continued until the frame panel 70 is slightly spaced from the board panel 80 as shown in the arrangement 90 of FIG. 4. They are slightly spaced because each of the first frame pads (33S in FIG. 1) now abut a corresponding one of the board pads (53S in FIG. 2).

After the processes of FIGS. 3 and 4 have been completed, each of the first sets 56S of components (introduced in FIG. 2) and each of first board sides (43S in FIG. 2) of the arrangement 90 of FIG. 4 appears within a respective one of the apertures 30S (introduced in FIG. 1) as shown in the enlarged view of FIG. 5. In particular, each of the first sets 56S of components is now received within a corresponding one of the apertures 30S and, although not visible in FIG. 5, each of the first frame pads (33S in FIG. 1) abuts a corresponding one of board pads (53S in FIG. 2). Although the board streets (82 in FIG. 2) are also not visible in FIG. 5, they are now aligned with the frame streets 72.

The abutted first frame pads and first board pads are now coupled together and, at the same time, the first sets 56S of components are coupled to the printed circuit paths (54S in FIGS. 2 and 10) within each of the apertures 30S. This coupling can be accomplished with various coupling elements such as solder, conductive epoxy and anisotropic conductive epoxy. Once this coupling is completed, an aperture fill 60S is applied to each of the first board sides 43S, the first sets 56S of components, and apertures 30S. Although the amount of this fill may differ in different package embodiments, it is shown in FIG. 6 to completely cover the first board sides and first sets of components and nearly fill the aperture.

In an important feature of the invention, the aperture fill 60S covers all of the first frame sides (23S in FIG. 1) and first board sides (43S in FIG. 2). In particular, the aperture fill 60S is urged to completely fill and cover the frame streets (72 in FIG. 1) on the first frame sides and the board streets (82 in FIG. 5 and 44S in FIG. 7) on the first board sides.

This insures that the fill completely surrounds all of the first frame pads (33S in FIG. 1) and first board pads (53S in FIG. 2). It has been found that this urging is substantially facilitated by providing vents in at least one of the frame streets and board streets to provide paths for release of air as the fill enters and fills the streets. Exemplary vents 92 are shown in one of the frame streets 72 of FIG. 6.

With the first sets of components 56S and the frame panel (70 in FIG. 1) now secured to the board panel (80 in FIG. 2) and with the aperture fill (60S in FIG. 6) in place, the second board pads 34S of each frame structure (22S in FIG. 1) now provide input/output access to each printed circuit board structure (24S in FIG. 2). The arrangement 90 of FIG. 4 can now be flipped over to appear as the arrangement 100 of FIG. 7 in which the board panel 80 is above the frame panel 70.

With the arrangement 100, the board panel 80 can now receive second sets 58S of components to complete each of the printed circuit board structures 24S that were introduced in FIG. 2. Each of these structures lies between centerlines 102 of the board streets 82 that were introduced in FIG. 2. The second sets 58S are now coupled to the board panel 80. As stated above, this coupling can be accomplished with various elements such as solder, conductive epoxy and anisotropic conductive epoxy.

In a package embodiment in which the coupling of the first and second sets 56S and 58S to the board panel is realized with solder, the heat required for this process will at least partially reflow the solder used to couple the first frame pads to the board pads and to couple the first sets of components to the first board side as described above relative to FIGS. 5 and 6. However, the aperture fill 60S of FIG. 6 covers the first sets and also fills the frame and board streets and surrounds the abutted first frame pads and first board pads so that, in another feature of the invention, the solder is safely contained in place and then hardens along with the solder on the second board side.

Figure 7:
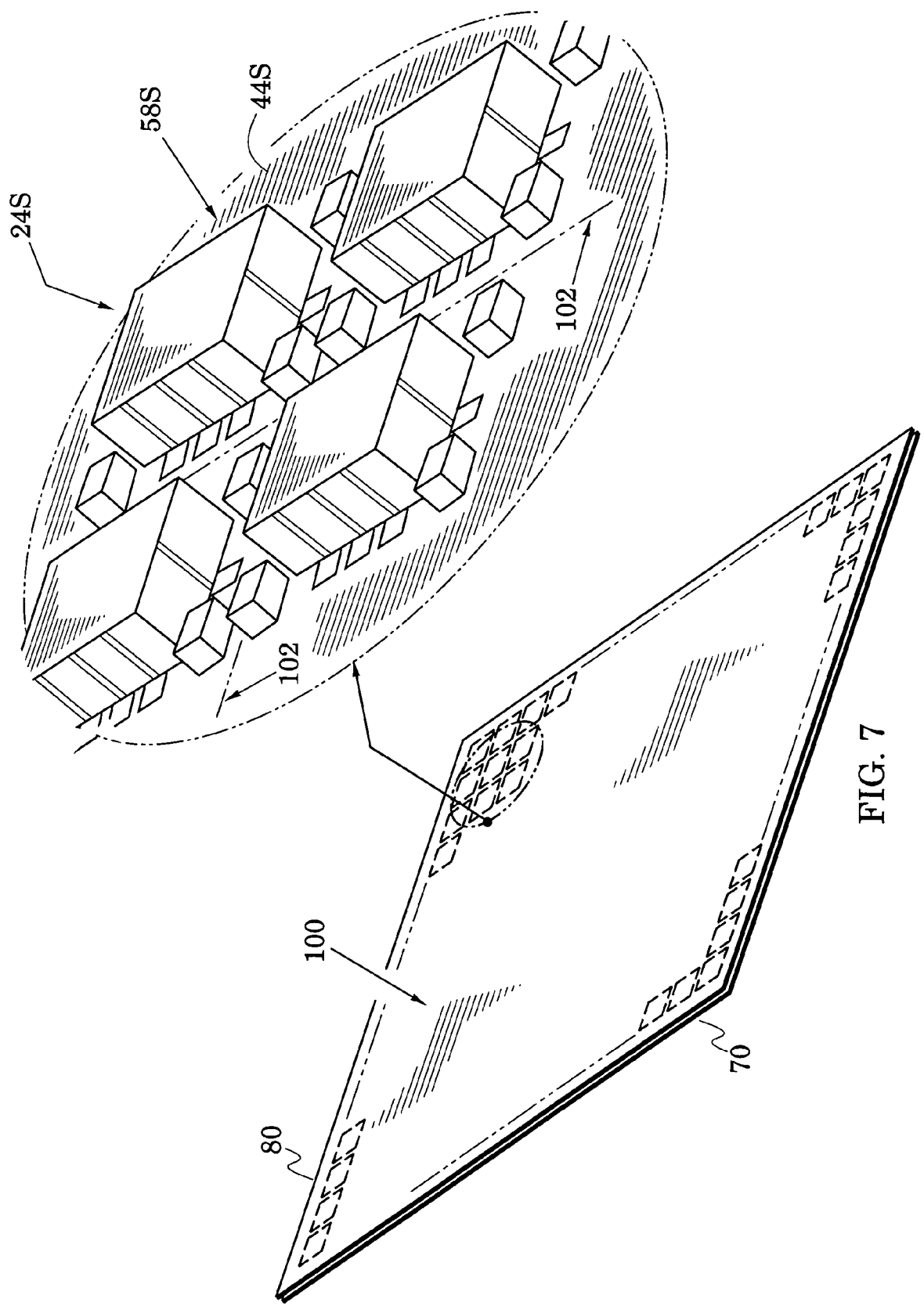
FIG. 7 includes an isometric view of abutted frame and board panels after they have been inverted from their orientation in FIG. 4 and further includes an enlarged view of printed circuit board structures on a second side of the board panel that receive second sets of electronic components.
Figure 9:
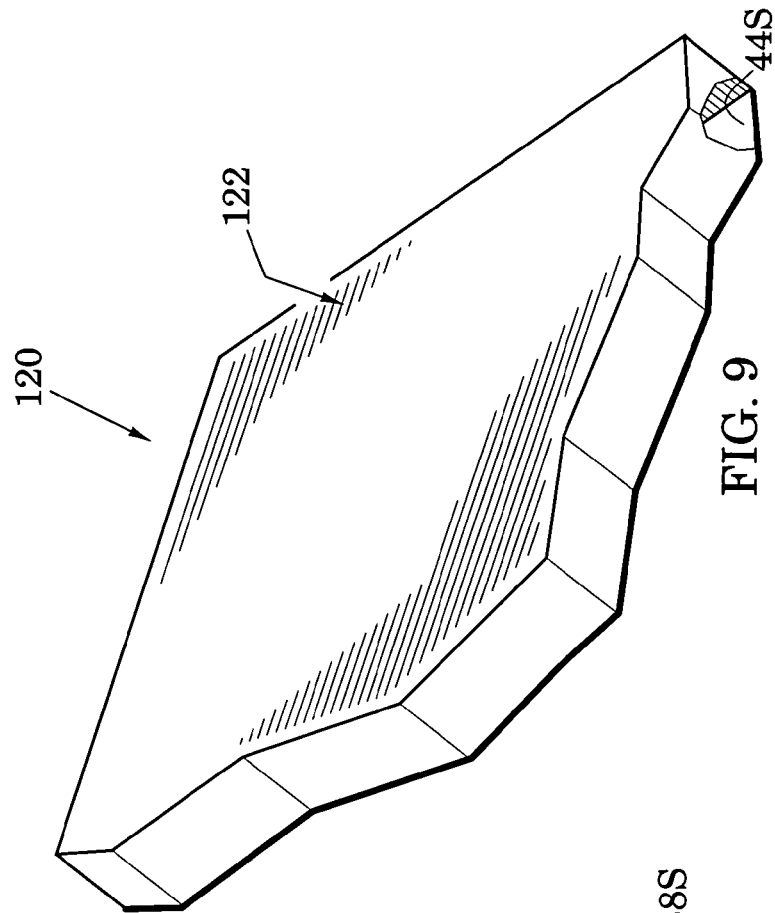
FIG. 9 is an isometric view which shows a portion of a board fill installed with aid of the dam of FIG. 8.

In a package embodiment, a dam 112 can now be secured around the edges of the board panel (80 in FIG. 2) as shown in the diagram 110 of FIG. 8 which repeats the structures illustrated in the enlarged view of FIG. 7. With the dam in place, a board fill 122 can be applied to cover the second board side 44S and the second sets 58S of components which have been coupled to this side. After the dam 112 has been removed, the diagram 110 of FIG. 8 has been modified to appear as the diagram 120 of FIG. 9 which shows the board fill 122. A corner of the board fill has been removed in FIG. 9 to reveal the second board side 44S below.

An exemplary fill material for the aperture and board fills 26S and 28S is an organic polymer which can be dispensed in a liquid form (e.g., Loctite/Hysol CB-0260-1 and Namics U8444-11). These materials are especially suited for flowing and wetting surfaces and encapsulating and filling small cracks around components and package structures. They generally cure and polymerize under exposure to an elevated thermal environment. The fully cured material is solid and rigid, forms an excellent barrier to moisture intrusion, produces a low stress on the encapsulated and underfilled components, and can survive multiple cycles from −55 to 125° C. Components (e.g., glass spheres or alumina nitride particles) may be added to the fill to modify its thermal coefficient of expansion, thermal conductivity or modulus.

With the first sets 56S of components installed on the first board sides 43S (shown in FIG. 2), the aperture fills 60S installed in the apertures 30S (shown in FIG. 6), the second sets 58S of components installed on the second board sides 44S (shown in FIG. 7), and the board fill 122 installed over the second sets (shown in FIG. 8), the frame streets 72 and board streets 82 can now be cut through to provide a plurality of the electronics package 20 that is shown in FIG. 10. In this process, each of the frame structures 22S of FIG. 1 is converted into a frame of an electronics package that is bounded by an outer frame wall 37 and each of the printed circuit board structures 24S of FIG. 2 is converted into a printed circuit board of an electronics package. For example, a corresponding pair of them is converted into the frame 22 and board 24 of FIG. 10.

It is apparent that the processes of FIGS. 1-9 have essentially structured the frame 22 and printed circuit board 24 of FIG. 10 to form a cavity that is defined by the walls 31 of the aperture 30 and the first board side 43. This cavity has been filled with the aperture fill 26 but the frame 24 rises above this fill to present the second frame pads 34 as input/output access for the electronics package 20. The first set 56 of electronic components are positioned in this cavity and the second set 58 of electronic components are positioned on the second board side 44 and covered by the board fill 28. Thus the first and second sets of electronic components are essentially stacked over the second frame pads 34 and these pads provide input/output access for the components.

In a significant feature of the invention, this stacked package arrangement significantly reduces the footprint (area of the second frame pads) that would be required with conventional package arrangements (e.g., ball grid array (BGA) packages and lead grid array (LGA) packages) that contained the same electronic components). In another significant feature of the invention, the cavity and the stacked arrangement are realized with frame and board panels (70 and 80 in FIGS. 1 and 2) whose planar forms substantially reduce package fabrication time and cost because they facilitate the use of modern high-speed printed circuit board (PCB) fabrication processes.

Specifically, the apertures 30S and vias 35S of FIG. 1 can be respectively realized with fast punching processes and with plating and organic fill processes. The planar frame and board panels can be quickly formed from various board materials (e.g., bismaleimide-triazine (BT) resin laminates and copper metallization). The fabrication step shown in FIG. 2 can be realized by applying solder paste to the board panel with batch screen printing processes before components are placed with fast pick and flow processes. Solder mask processes can be used to passivate the printed circuit paths (54S in FIG. 2) and outline attachment pads and wirebond pads of these paths. An oven process then reflows the solder past to simultaneously join (see FIGS. 3-5) the frame and board panels and couple the components to the board panel.

Simultaneous fill processes subsequently realize the aperture fills 60S of FIG. 6 wherein the vents 92 of FIG. 6 may be used to aid in urging the fill to extend into the frame and board streets and completely surround the joined and abutted first frame pads and board pads. This urging may also be enhanced by proper choice of the width of the frame and board streets and by initially filling apertures in a first set of apertures and subsequently filling a second set of apertures that each lie between those of the first set.

In FIG. 1, it is noted that the frame pads of each frame structure 22S lie side-by-side with the frame pads of the adjacent frame structure. In some package embodiments, it has been found that urging of the fill (to extend into the frame and board streets and completely surround the joined and abutted first frame pads and board pads) is enhanced by moving adjacent frame pads somewhat out of this side-by-side arrangement.

Batch screen printing processes, pick and flow processes, solder mask processes and another oven process can then be used to couple the second set of electronic components to the second board side as shown in FIG. 7. Finally, high-speed cutting processes cut through the frame and board streets to release the individual electronic packages. It is noted that the planar form of the frame and board panels also enhances the reliability and package yield of these fabrication processes.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An electronic structure to form a plurality of electronic packages each carrying electronic components, comprising:
   a frame panel configured to form a plurality of:
   a frame that has a first frame side, a second frame side spaced from said first frame side, space for an outer frame wall that extends from said first frame side to said second frame side to thereby bound said frame, and an aperture wall that is spaced inward from said outer frame wall and that extends between said first and second frame sides to thereby define an aperture;
   first frame pads carried on said first frame side, spaced inward from said outer frame wall and arranged to surround said aperture;
   second frame pads carried on said second frame side, spaced inward from said outer frame wall and arranged to surround said aperture; and
   interconnect structures spaced inward from said outer frame wall and arranged to each connect a respective one of said first frame pads to a respective one of said second frame pads; and
   a board panel configured to form a plurality of:
   a printed circuit board that has first and second board sides;
   board pads arranged on said first board side to each contact a respective one of said first frame pads and to be spaced inward from said outer frame wall; and
   printed circuit paths that are arranged on said first board side to communicate with said board pads and receive said electronic components within said aperture;
   said first and second frame pads, said interconnect structures and said board pads thereby spaced inward from said outer frame wall to facilitate cutting through of said frame panel and said board panel to thereby form the outer frame wall of said electronic packages.

2. The package of claim 1, wherein said frame panel and said board panel each comprise resin laminates and said printed circuit paths comprise copper metallization.

3. The package of claim 1, wherein each of said interconnect structures is a via through said frame that extends between said first and second frame sides.

4. The package of claim 1, wherein each of said interconnect structures is positioned on said aperture wall.

5. The package of claim 1, further including an aperture fill arranged to fill said aperture, cover said first board side, and surround said first frame pads and said board pads.

* * * * *

UNITED STATES PATENT AND TRADEMARK OFFICE
CERTIFICATE OF CORRECTION

| | | |
|---|---|---|
| PATENT NO. | : 7,777,313 B2 | |
| APPLICATION NO. | : 11/345147 | |
| DATED | : August 17, 2010 | |
| INVENTOR(S) | : Buck, Jr. et al. | |

It is certified that error appears in the above-identified patent and that said Letters Patent is hereby corrected as shown below:

Last page, column 7, line 10, remove "to" and after "configured" please add --and cut through to thereby--

Signed and Sealed this
Fourteenth Day of June, 2011

David J. Kappos
*Director of the United States Patent and Trademark Office*